(12) United States Patent
Choi et al.

(10) Patent No.: US 8,704,112 B2
(45) Date of Patent: Apr. 22, 2014

(54) THERMOELECTRIC TOUCH SENSOR

(75) Inventors: Duk-hyun Choi, Hwaseong-si (KR);
Jae-young Choi, Suwon-si (KR);
Eok-su Kim, Seongnam-si (KR);
Jong-soo Rhyee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 562 days.

(21) Appl. No.: 12/827,266

(22) Filed: Jun. 30, 2010

(65) Prior Publication Data

US 2011/0155478 A1 Jun. 30, 2011

(30) Foreign Application Priority Data

Dec. 30, 2009 (KR) .......................... 10-2009-0134921

(51) Int. Cl.
*G08C 21/00* (2006.01)

(52) U.S. Cl.
USPC ....................................... 178/18.03; 345/173

(58) Field of Classification Search
None
See application file for complete search history.

(56) References Cited

U.S. PATENT DOCUMENTS

| | | | |
|---|---|---|---|
| 2003/0016282 A1 | 1/2003 | Koizumi | |
| 2003/0234037 A1* | 12/2003 | Tanaka | 136/205 |
| 2007/0077691 A1* | 4/2007 | Watanabe | 438/149 |
| 2008/0284712 A1* | 11/2008 | Muto et al. | 345/101 |
| 2009/0085894 A1* | 4/2009 | Gandhi et al. | 345/175 |

FOREIGN PATENT DOCUMENTS

| | | |
|---|---|---|
| JP | 2004-241358 A | 8/2004 |
| JP | 2007-208682 A | 8/2007 |
| KR | 100719257 B1 | 5/2007 |
| KR | 1020080043414 A | 5/2008 |

* cited by examiner

*Primary Examiner* — Joseph Haley
*Assistant Examiner* — Emily Frank
(74) *Attorney, Agent, or Firm* — Cantor Colburn LLP

(57) ABSTRACT

A thermoelectric touch sensor includes a first electrode, a thin film layer provided on the first electrode and including a thermoelectric material, a second electrode provided on the thin film layer, a sensing unit which senses at least one of a current flowing between the first electrode and the second electrode and a voltage applied between the first electrode and the second electrode.

17 Claims, 2 Drawing Sheets

THERMOELECTRIC TOUCH SENSOR

CROSS-REFERENCE TO RELATED APPLICATION

This application claims priority to Korean Patent Application No. 10-2009-0134921, filed on Dec. 30, 2009, and all the benefits accruing therefrom under 35 U.S.C. §119, the content of which in its entirety is herein incorporated by reference.

BACKGROUND

1. Field

The present disclosure relates to a thermoelectric touch sensor.

2. Description of the Related Art

Touch sensors have been widely used as components of touch screen displays and as touch switches for various electronic products such as mobile phones. In general, the typical touch sensor may be categorized by type into resistive touch sensors and capacitive touch sensors.

The typical resistive touch sensor is operated by detecting flow of current between two electrodes which contact each other due to an externally applied pressure, wherein when the pressure is not applied, the two electrodes are separated by a predetermined distance from each other. The capacitive touch sensor is operated by detecting a change in the electrostatic capacity of the touch sensor generated when a human body or a specific object contacts the touch sensor.

SUMMARY

Additional aspects will be set forth in part in the description which follows and, in part, will be apparent from the description, or may be learned by practice of the presented embodiments.

According to an aspect of the present disclosure, a thermoelectric touch sensor includes a first electrode, a thin film layer provided on the first electrode and including a thermoelectric material, a second electrode provided on the thin film layer, a sensing unit which senses at least one of a current flowing between the first electrode and the second electrode and a voltage applied between the first electrode and the second electrode.

In one embodiment, the thermoelectric material may have a Seebeck coefficient greater than about 10 μV/K.

In one embodiment, the thermoelectric material may have an electric conductivity greater than 10 S/cm.

In one embodiment, the thermoelectric material may be a transparent thermoelectric material.

In one embodiment, the first electrode or the second electrode may be a transparent electrode.

In one embodiment, the thermoelectric material may include at least one of materials selected from a group consisting of $Bi_2Te_3$, $Bi_2Sb_3$, and $Bi_2Se_3$ and combinations thereof.

In one embodiment, the thin film layer may include an electron blocking material or a hole blocking material.

In one embodiment, the electron blocking material or the hole blocking material may be mixed with the thermoelectric material in a same layer.

In one embodiment, the electron blocking material or the hole blocking material may form a multilayer structure with the thermoelectric material.

In one embodiment, the electron blocking material may be hole conducting semiconducting polymer or a derivative of the hole conducting semiconducting polymer.

In one embodiment, the electron blocking material may include poly(3-hexylthiophene) ("P3HT").

In one embodiment, the heat conductivity of the second electrode may be greater than that of the first electrode.

In one embodiment, the first electrode and the second electrode may include at least one material selected from a group consisting of Cu, Ag, and Au and combinations thereof.

In one embodiment, the first electrode may be formed of a metal oxide and the second electrode may be formed of metal material.

In one embodiment, the metal oxide may include at least one material selected from a group consisting of indium tin oxide ("ITO"), In-doped zinc oxide ("IZO"), and Ga-doped zinc oxide ("GZO").

In one embodiment, the metal may include at least one material selected from a group consisting of Cu, Ag, and Au and combinations thereof.

In one embodiment, the thin film layer may include graphene.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
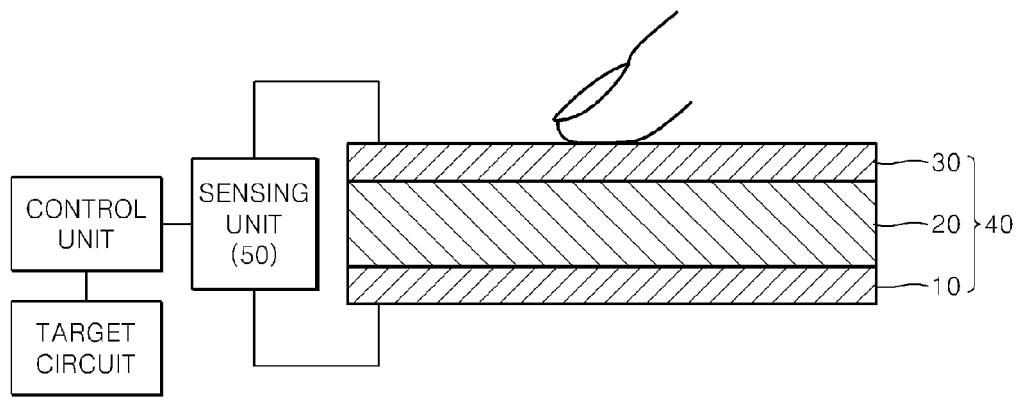
FIG. 1 is a cross-sectional view of an embodiment of a thermoelectric touch sensor according to the present disclosure.

Embodiments now will be described more fully hereinafter with reference to the accompanying drawings, in which embodiments of the disclosure are shown. The embodiments may, however, be embodied in many different forms and should not be construed as limited to the embodiments set forth herein. Rather, these embodiments are provided so that this disclosure will be thorough and complete, and will fully convey the scope of the embodiments to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be limiting thereof. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the disclosure.

All methods described herein can be performed in a suitable order unless otherwise indicated herein or otherwise clearly contradicted by context. The use of any and all examples, or exemplary language (e.g., "such as"), is intended merely to better illustrate the disclosure and does not pose a limitation on the scope thereof unless otherwise claimed. No language in the specification should be construed as indicating any non-claimed element as essential to the practice of the embodiments as used herein.

Hereinafter, the embodiments will be described in detail with reference to the accompanying drawings.

FIG. 1 is a cross-sectional view of an embodiment of a thermoelectric touch sensor 40 according to the present disclosure. Referring to FIG. 1, the thermoelectric touch sensor 40 includes a first electrode 10, a thin film layer 20, a second electrode 30 and a sensing unit 50. The sensing unit 50 may be connected to a control unit and the control unit may control a target circuit. The thin film layer 20 is provided on the first electrode 10 and the second electrode 30 is provided on the thin film layer 20. The sensing unit 50 is connected to the first electrode 10 and the second electrode 30. Although it is not illustrated in the drawing, an insulation layer may be provided on a surface of the second electrode 30 substantially opposite the thin film layer 20.

The first electrode 10 may include at least one selected from a group consisting of Cu, Ag, and Au and combinations thereof. When the first electrode 10 is formed of a metal material, the first electrode 10 may easily make an ohmic contact with the thin film layer 20 formed of a thermoelectric material. The first electrode 10 may be a transparent electrode when the thermoelectric touch sensor 40 is used with a transparent touch screen. Also, embodiments of the first electrode 10 may include a metal oxide material. The metal oxide may be at least one material selected from a group consisting of indium tin oxide ("ITO"), In-doped zinc oxide ("IZO"), and a Ga-doped zinc oxide ("GZO"). In one embodiment, the heat conductivity of the first electrode 10 may be lower than that of the second electrode 30. Such a configuration reduces a change in the temperature of the second electrode 30 due to a physical contact with a user so that a thermal gradient between the second electrode 30 and the first electrode 10 may be maintained to be relatively constant.

The thin film layer 20 may be provided on the first electrode 10. The thin film layer 20 may be formed of a thermoelectric material. In one embodiment, the thermoelectric material may have a Seebeck coefficient greater than about 10 μVolts (V)/Kelvin (K). Also, in one embodiment the thermoelectric material may have an electrical conductivity greater than about 10 siemens(S)/centimetre (cm). The above values for the Seebeck coefficient and the electric conductivity are values which may efficiently implement a thermoelectric effect in the thermoelectric touch sensor 40, but alternative embodiments may include other values. When a thermoelectric material having a value smaller than the Seebeck coefficient and the electric conductivity is used, the thermoelectric touch sensor 40 may not be efficiently implemented. The thermoelectric material may be transparent when the thermoelectric touch sensor 40 is used in a transparent touch screen display. The thermoelectric material may include at least one material selected from a group consisting of $Bi_2Te_3$, $Bi_2Sb_3$, and $Bi_2Se_3$ and combinations thereof.

Also, the thin film layer 20 may include at least one of an electron blocking material and a hole blocking material. The electron blocking material or the hole blocking material may be mixed with the thermoelectric material in the same layer, i.e., the electron blocking material or the hole blocking material may be uniformly and continuously mixed within the thickness of the thermoelectric material. In another embodiment, the electron blocking material or the hole blocking material may form multi-layers with the thermoelectric material, e.g., the thin film layer 20 may include multiple layers, at least some of the layers being composed of different materials. In the configuration wherein the thin film layer 20 includes the electron blocking material or the hole blocking material, a thermoelectric effect may be generated to a sufficient degree that the thermoelectric touch sensor 40 may be implemented utilizing the thermoelectric effect. That is, the thin film layer 20 of the thermoelectric touch sensor 40 may be designed to generate a thermoelectric effect such that the thermoelectric touch sensor 40 can be implemented using the thermoelectric effect by adjusting a degree of mixture of the electron blocking material or the hole blocking material and the thermoelectric material, the number of layers of a multilayer structure, or the order of stacking of those layers.

Figure 2:
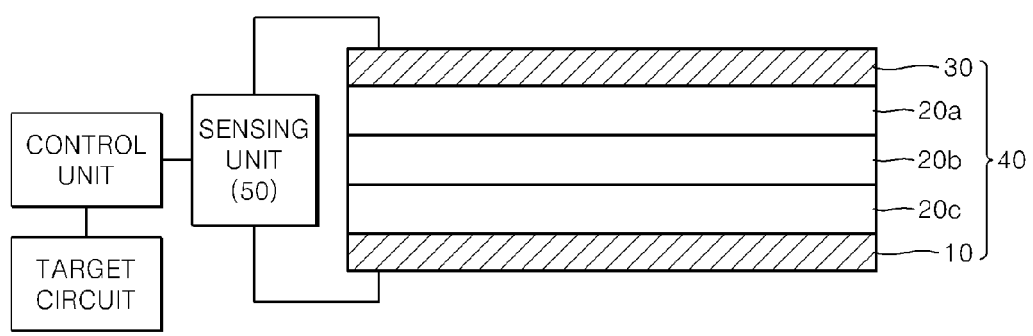
FIG. 2 is a cross-sectional view of an embodiment of a thermoelectric touch sensor having a thin film layer including a multilayer structure.

FIG. 2 illustrates an embodiment of the multilayer structure. Referring to FIG. 2, the thin film layer 20 may include a first layer 20*a*, a second layer 20*b*, and a third layer 20*c*. For example, in one embodiment the first layer 20*a* may be formed of the electron blocking material, the second layer 20*b* may be formed of the thermoelectric material, and the third layer 20*c* may be formed of the hole blocking material. However, the order or material of the layers is not limited thereto. The electron blocking material, for example, may be a hole-conducting semiconducting polymer such as poly(3-hexylthiophene) ("P3HT"), or derivatives of the hole conducting semiconducting polymer.

Also, embodiments include configurations wherein the thin film layer 20 may include graphene. In the graphene, polycyclic aromatic molecules are formed as a plurality of carbon atoms are connected in a covalent bond. In the graphene, the carbon atoms connected in a covalent bond may form a 6-membered ring as a basic repetition unit, but a 5-membered ring and/or a 7-membered ring may be alternatively, or additionally, further included. As a result, the graphene appears to be a single layer of the carbon atoms connected in a covalent bond. Although in one embodiment the graphene may be formed in a single layer, alternative embodiments include configurations wherein the graphene may be formed in a plurality of layers by depositing a plurality of single layers, thus forming a graphene layer with a maximum thickness of about 100 nanometers (nm). The graphene may be mixed with the thermoelectric material in the same layer, or may form a multi-layer structure with the thermoelectric material. As the thin film layer 20 includes the graphene, the thermoelectric effect may be generated to a sufficient degree to implement the thermoelectric touch sensor 40. That is, the thin film layer 20 of the thermoelectric touch sensor 40 may be designed to generate the thermoelectric effect such that the thermoelectric touch sensor 40 can be implemented by adjusting a degree of mixture of the graphene and the thermoelectric material, the number of layers of a multilayer structure, or the order of stacking of the layers in the multiplayer structure. In FIG. 2, at least one of the first through third layers 20*a*, 20*b*, and 20*c* may be formed with the graphene.

A part of a human body may contact the second electrode 30. Alternatively, a part of a human body may contact the insulation layer (not shown) provided on the second electrode 30. In embodiments where it is present, the insulation layer may be formed of a material exhibiting a high heat conductivity so that heat may be quickly transferred to the second electrode 30. As described above, the second electrode 30 may include a metal material. That is, the second electrode 30 may include at least one of a material selected from a group consisting of Cu, Ag, and Au and combinations thereof. When the second electrode 30 is formed of metal, the second electrode 30 may easily make an ohmic contact with the thin film layer 20 that is formed of a thermoelectric material. When the thermoelectric touch sensor 40 is used in a transparent touch screen, the second electrode 30 may be a transparent electrode. The second electrode 30 may have a high heat conductivity to quickly absorb heat from the part of a human body in contact therewith. In an embodiment wherein the second electrode faces an outside, the heat conductivity of the second electrode 30 may be greater than that of the first electrode 10. This is to facilitate the transfer of heat from the human body to the thin film layer 20 when the part of a human body contacts the second electrode 30, and also to prevent the first electrode 10 from being influenced by a change in the temperature of the second electrode 30 due to the physical contact, thereby maintaining a thermal gradient between the first electrode 10 and the second electrode 30.

The operation principle of the thermoelectric touch sensor 40 will be described below. For a general resistive touch sensor, durability is weak due to the continual flexing of the apparatus and the tight construction tolerances and the implementation of multi touch input and soft touch input is difficult. For a general capacitive touch sensor, an input using a stylus pen is difficult and a malfunction may occur under a high-noise environment. To address these problems of the general touch sensor, the thermoelectric touch sensor 40 employs a touch sensor using a thermoelectric effect.

The thermoelectric effect describes an energy conversion phenomenon between heat energy (also called thermal energy) and electrical energy. That is, an electromotive force is generated when a carrier in a thermoelectric device moves due to a generation of different temperatures between the opposite ends of the thermoelectric device. The thermoelectric effect may include a Seebeck effect in which the electromotive force is generated using a difference in the temperature between the opposite ends of the thermoelectric device, a Peltier effect in which cooling and heating are performed using an electromotive force, and a Thomson effect in which the electromotive force is generated due to a difference in the temperature between the opposite ends of a conductive body.

When it is assumed that the room temperature is about 26° C. and the temperature of a human body is about 36.5° C., the temperature of the thermoelectric touch sensor 40 before contacting the part of a human body may be about room temperature, e.g., 26° C. When the part of a human body contacts the second electrode 30, the temperature of the second electrode 30 may be about 36.5° C., reaching a similar temperature as the human body. Thus, a thermal gradient of about 10.5° C. is generated between the first electrode 10 and the second electrode 30. When the thermal gradient is generated, an electromotive force is generated between the first electrode 10 and the second electrode 30 and thus current flows therebetween. When the thin film layer 20 formed of a thermoelectric material is provided between the first electrode 10 and the second electrode 30, a greater electromotive force may be generated between the first electrode 10 and the second electrode 30. The thermoelectric touch sensor 40 detects that the part of a human body contacts the thermoelectric touch sensor 40, by sensing the generated voltage or current.

In the thermoelectric touch sensor 40, the sensing unit 50 senses the voltage or current generated by the thermoelectric effect due to the thermal gradient between the first electrode 10 and the second electrode 30 due to the contact of the part of a human body. When the sensing unit 50 senses the voltage or current and transfers the sensed voltage or current to the control unit, the control unit drives the target circuit as instructed by the contact. For example, when the thermoelectric touch sensor 40 is a switch and the target circuit is a lamp, the sensing unit 50 senses the contact of the part of a human body and transmits a sense signal to the control unit so that the control unit may turn the lamp, which in this case is the target circuit, on or off.

Also, since the thermoelectric touch sensor 40 implements a touch sensor by sensing the voltage or current generated by the thermoelectric effect without an externally provided power source, the thermoelectric touch sensor 40 may be a self-powered device. Thus, an additional power source may not be needed for driving the thermoelectric touch sensor 40. When the thin film layer 20 is formed of a transparent thermoelectric material in the thermoelectric touch sensor 40, a transparent flexible self-powered touch sensor may be implemented.

Figure 3:
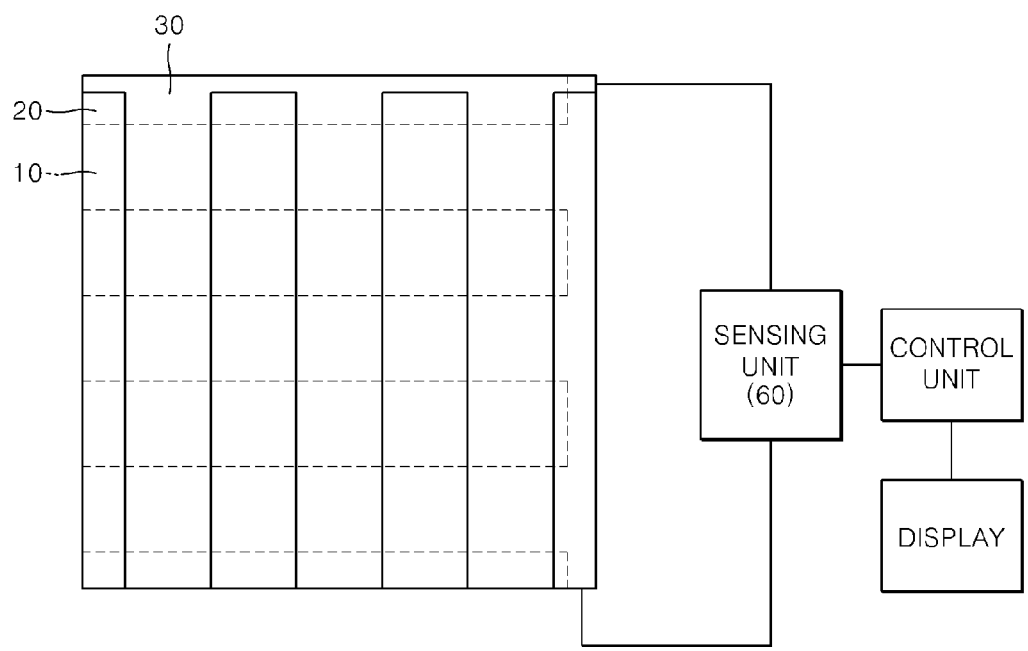
FIG. 3 is a top plan view schematically illustrating an embodiment of a thermoelectric touch sensor applied to a touch screen.

FIG. 3 is a top plan view schematically illustrating an embodiment of a thermoelectric touch sensor applied to a touch screen. Referring to FIG. 3, the thermoelectric touch sensor is of an add-on type in which the thermoelectric touch sensor 40 is placed on a screen of a display. Although it is not illustrated in the drawing, an on-cell type thermoelectric touch sensor may be used in which the thermoelectric touch sensor is placed on a light emitting layer of the display. The first electrode 10 and the second electrode 30 are insulated from one another and arranged crossing each other, e.g., substantially perpendicular to one another, in an array format with the thin film layer 20 interposed therebetween. The first electrode 10, the thin film layer 20, and the second electrode 30 may be formed of a transparent material to view a display screen located under the thermoelectric touch sensor. When there is a contact of a part of a human body at a portion where the first electrode 10 and the second electrode 30 cross each other, a voltage or current may be generated at the intersecting region due to the thermoelectric effect. Then, a sensing unit 60 senses the voltage or current to transmit a sense signal including information on the position of the portion contacted by the part of a human body, to the control unit. The control unit carries out a command intended by the contact so that the image displayed on the display may be accordingly controlled.

It should be understood that the embodiments described therein should be considered in a descriptive sense only and not for purposes of limitation. Descriptions of features or aspects within each embodiment should typically be considered as available for other similar features or aspects in other embodiments.

What is claimed is:

1. A thermoelectric touch sensor comprising:
    a first electrode;
    a thin film layer provided on the first electrode and including a thermoelectric material;
    a second electrode provided on the thin film layer;
    a sensing unit which senses at least one of a current flowing between the first electrode and the second electrode and a voltage applied between the first electrode and the second electrode,
    wherein the thin film generates electromotive force due to thermal gradient between the first electrode and the second electrode and the sensing unit senses the at least one of the current and the voltage between the first electrode and the second electrode due to the electromotive force.

2. The thermoelectric touch sensor of claim 1, wherein the thermoelectric material has a Seebeck coefficient greater than about 10 μV/K.

3. The thermoelectric touch sensor of claim 1, wherein the thermoelectric material has an electric conductivity greater than about 10 S/cm.

4. The thermoelectric touch sensor of claim 1, wherein the thermoelectric material is transparent to visible wavelength light.

5. The thermoelectric touch sensor of claim 4, wherein at least one of the first electrode and the second electrode is transparent to visible wavelength light.

6. The thermoelectric touch sensor of claim 1, wherein the thermoelectric material comprises a material selected from the group consisting of $Bi_2Te_3$, $Bi_2Sb_3$, and $Bi_2Se_3$ and combinations thereof.

7. The thermoelectric touch sensor of claim 1, wherein the thin film layer comprises at least one of an electron blocking material and a hole blocking material.

8. The thermoelectric touch sensor of claim 7, wherein the at least one of the electron blocking material and the hole blocking material is mixed with the thermoelectric material in a same layer.

9. The thermoelectric touch sensor of claim 7, wherein the at least one of the electron blocking material and the hole blocking material forms a multilayer structure with the thermoelectric material.

10. The thermoelectric touch sensor of claim 7, wherein the electron blocking material is one of a hole conducting semiconducting polymer and a derivative of the hole conducting semiconducting polymer.

11. The thermoelectric touch sensor of claim 7, wherein the electron blocking material comprises poly(3-hexylthiophene).

12. The thermoelectric touch sensor of claim 1, wherein a heat conductivity of the second electrode is greater than that of the first electrode.

13. The thermoelectric touch sensor of claim 1, wherein the first electrode and the second electrode comprise at least one material selected from the group consisting of Cu, Ag, and Au and combinations thereof.

14. The thermoelectric touch sensor of claim 1, wherein the first electrode comprises a metal oxide and the second electrode comprises a metal.

15. The thermoelectric touch sensor of claim 14, wherein the metal oxide comprises at least one material selected from the group consisting of indium tin oxide, In-doped zinc oxide, and Ga-doped zinc oxide and combinations thereof.

16. The thermoelectric touch sensor of claim 14, wherein the metal comprises at least one material selected from the group consisting of Cu, Ag, and Au and combinations thereof.

17. The thermoelectric touch sensor of claim 1, wherein the thin film layer comprises graphene.

* * * * *